(12) United States Patent
DeBrosse et al.

(10) Patent No.: US 10,360,958 B2
(45) Date of Patent: Jul. 23, 2019

(54) DUAL POWER RAIL CASCODE DRIVER

(71) Applicant: INTERNATIONAL BUSINESS MACHINES CORPORATION, Armonk, NY (US)

(72) Inventors: John K. DeBrosse, Colchester, VT (US); Yutaka Nakamura, Kita-ku (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/617,000

(22) Filed: Jun. 8, 2017

(65) Prior Publication Data

US 2018/0358062 A1   Dec. 13, 2018

(51) Int. Cl.
*G11C 8/08* (2006.01)
*G11C 11/408* (2006.01)
*G11C 11/22* (2006.01)
*G11C 11/16* (2006.01)
*G11C 13/00* (2006.01)
(Continued)

(52) U.S. Cl.
CPC ............ *G11C 8/08* (2013.01); *G11C 11/1657* (2013.01); *G11C 11/2257* (2013.01); *G11C 11/4085* (2013.01); *G11C 13/0028* (2013.01); *G11C 16/08* (2013.01); *G11C 5/147* (2013.01); *G11C 13/0004* (2013.01); *G11C 16/0408* (2013.01)

(58) Field of Classification Search
CPC ....................................................... G11C 8/08
See application file for complete search history.

(56) References Cited

U.S. PATENT DOCUMENTS

| 8,120,968 | B2 | 2/2012 | Reohr et al. |
| 8,164,971 | B2 | 4/2012 | Wang et al. |

(Continued)

FOREIGN PATENT DOCUMENTS

| CN | 101068106 A | 11/2007 |
| CN | 102622024 A | 8/2012 |

(Continued)

OTHER PUBLICATIONS

Barth et al., "A 45 nm SOI Embedded DRAM Macro for the POWER™ Processor 32 MByte On-Chip L3 Cache", IEEE Journal of Solid-State Circuits, vol. 46, No. 1, Jan. 2011, pp. 64-75.

(Continued)

*Primary Examiner* — Huan Hoang
*Assistant Examiner* — Jay W. Radke
(74) *Attorney, Agent, or Firm* — Michael A. Petrocelli (57) ABSTRACT

A method includes applying a first voltage to a source of a first p-channel FET connected in series with a second p-channel FET, applying a second voltage, lower than the first voltage, to a source of a third p-channel FET connected in series with a fourth p-channel FET, applying a third voltage, lower than the first and second voltages, to a source of a second n-channel FET connected in series with a first n-channel FET, drains of the second p-channel FET, the fourth p-channel FET, and the first n-channel FET connect at a connection point including an output terminal for outputting an output signal, and outputting one of the first voltage, the second voltage, and the third voltage from the output terminal based on input signals inputted to corresponding gates of the first p-channel FET, the third p-channel FET, the fourth p-channel FET, and the second n-channel FET.

18 Claims, 4 Drawing Sheets

(51) Int. Cl.
*G11C 16/08* (2006.01)
*G11C 16/04* (2006.01)
*G11C 5/14* (2006.01)

(56) References Cited

U.S. PATENT DOCUMENTS

| | | |
|---|---|---|
| 8,970,572 B2 | 3/2015 | Kim |
| 9,007,811 B1 | 4/2015 | Andre et al. |
| 9,117,547 B2 | 8/2015 | Barth, Jr. |
| 9,355,697 B2 | 5/2016 | Earle et al. |
| 2003/0128570 A1* | 7/2003 | Tanaka ............... G11C 11/22 365/145 |
| 2007/0025169 A1* | 2/2007 | Houston ............... G11C 8/08 365/206 |
| 2007/0121359 A1* | 5/2007 | Kanda ............... G11C 16/24 365/51 |
| 2008/0191187 A1* | 8/2008 | Lung ............... G11C 13/0004 257/4 |
| 2009/0027810 A1* | 1/2009 | Horng ............... B82Y 25/00 360/324.2 |
| 2011/0199837 A1* | 8/2011 | Reohr ............... G11C 8/08 365/189.06 |
| 2011/0299355 A1* | 12/2011 | Rana ............... G11C 8/08 365/230.06 |
| 2012/0014163 A1* | 1/2012 | Yamazaki ............ G11C 7/1048 365/148 |
| 2014/0119101 A1* | 5/2014 | Wang ............... G11C 8/08 365/154 |
| 2015/0162059 A1 | 6/2015 | Fredeman et al. |
| 2017/0085265 A1 | 3/2017 | Roham |

FOREIGN PATENT DOCUMENTS

| | | |
|---|---|---|
| CN | 102947887 A | 2/2013 |
| CN | 104639149 A | 5/2015 |

OTHER PUBLICATIONS

Fredeman et al., "A 14nm 1.1Mb Embedded DRAM Macro with 1ns Access", ISSCC 2015 / Session 17 / Embedded Memory and DRAM I/O / 17.4, 2015 IEEE International Solid-State Circuits Conference, 3 pages.

International Search Report and Written Opinion, International Application No. PCT/IB2018/054020, International Filing Date Jun. 6, 2018.

* cited by examiner

DUAL POWER RAIL CASCODE DRIVER

BACKGROUND

The present invention generally relates to integrated circuit memories, and more particularly to an automatically switching dual power rail cascode driver.

Miniaturization of field effect transistor (FET) devices has been advanced continuously for higher integration and higher performance of integrated circuits. It is known that the size of a FET is reduced according to the so-called "scaling law". In the scaling law, a thickness of the FET's gate oxide film gets thinner as generations, i.e. technology nodes, change. For example, in the 14 nm technology node, the thickness of the gate oxide film is about 1.2 nm and the gate length is about 20 nm. A technology node area in this generation is approximately 196 $nm^2$. In this technology node, an allowable voltage for a FET device may be approximately 0.8 V, for example. The term "allowable voltage" may refer to a voltage which is constantly or continuously applied to the FET without affecting its useful life.

Thin- and thick-oxide FETs may be exposed to regular (e.g., 0.8V) and high (e.g., 1.4V) voltages reliably in complementary-metal-oxide semiconductor (CMOS) technologies. At around the 14 nm technology node, the FET type was changed to fin from planar to scale further, as a result device manufacturing changed to only thin-oxide FETs. Due to thin-oxide FETs characteristics, long-term exposure to high voltages may cause damages to thin-oxide FETs, particularly to the gate dielectric and source/drain diffusion junctions, which may in turn reduce the life of thin-oxide FET devices.

SUMMARY

According to an embodiment of the present invention, there is provided a driver including a first p-channel field effect transistor (FET), a second p-channel FET, a third p-channel FET, a fourth p-channel FET, a first n-channel FET, a second n-channel FET, and an output terminal. The first p-channel FET and the second p-channel FET are connected in series. The third p-channel FET and the fourth p-channel FET are connected in series. The first n-channel FET and the second n-channel FET are connected in series. The output terminal outputs an output signal. The output terminal is a connection point at which a drain of the second p-channel FET, a drain of the fourth p-channel FET, and a drain of the first n-channel FET are connected to each other. A first voltage is applied to a source of the first p-channel FET. A second voltage being lower than the first voltage is applied to a source of the third p-channel FET. A third voltage being lower than the first voltage and the second voltage is applied to a source of the second n-channel FET. One of the first voltage, the second voltage, and the third voltage is outputted from the output terminal based on input signals inputted to corresponding gates of the first p-channel FET, the third p-channel FET, the fourth p-channel FET, and the second n-channel FET.

According to another embodiment of the present invention, there is provided a dynamic random-access memory (DRAM) including plural memories arranged in an array and a driver for driving the memories. Each of the memories has at least an access field effect transistor (FET) and a storage capacitor. The driver is coupled to each gate of the corresponding memories. The driver includes a first p-channel FET, a second p-channel FET, a third p-channel FET, a fourth p-channel FET, a first n-channel FET, a second n-channel FET, and an output terminal. The first p-channel FET and the second p-channel FET are connected in series. The third p-channel FET and the fourth p-channel FET are connected in series. The first n-channel FET and the second n-channel FET are connected in series. The output terminal outputs an output signal. The output terminal is a connection point at which a drain of the second p-channel FET, a drain of the fourth p-channel FET, and a drain of the first n-channel FET are connected to each other. A first voltage is applied to a source of the first p-channel FET. A second voltage being lower than the first voltage is applied to a source of the third p-channel FET. A third voltage being lower than the first voltage and the second voltage is applied to a source of the second n-channel FET. One of the first voltage, the second voltage, and the third voltage is outputted from the output terminal based on input signals inputted to corresponding gates of the first p-channel FET, the third p-channel FET, the fourth p-channel FET, and the second n-channel FET.

According to still another embodiment of the present invention, there is provided a flash memory including plural memories arranged in an array and a driver for driving the memories. Each of the memories has at least an access field effect transistor (FET). The driver is coupled to each gate of the corresponding memories. The driver includes a first p-channel FET, a second p-channel FET, a third p-channel FET, a fourth p-channel FET, a first n-channel FET, a second n-channel FET, and an output terminal. The first p-channel FET and the second p-channel FET are connected in series. The third p-channel FET and the fourth p-channel FET are connected in series. The first n-channel FET and the second n-channel FET are connected in series. The output terminal outputs an output signal. The output terminal is a connection point at which a drain of the second p-channel FET, a drain of the fourth p-channel FET, and a drain of the first n-channel FET are connected to each other. A first voltage is applied to a source of the first p-channel FET. A second voltage being lower than the first voltage is applied to a source of the third p-channel FET. A third voltage being lower than the first voltage and the second voltage is applied to a source of the second n-channel FET. One of the first voltage, the second voltage, and the third voltage is outputted from the output terminal based on input signals inputted to corresponding gates of the first p-channel FET, the third p-channel FET, the fourth p-channel FET, and the second n-channel FET.

According to still another embodiment of the present invention, there is provided a ferroelectric random access memory (FeRAM) including plural memories arranged in an array and a driver for driving the memories. Each of the memories has at least an access field effect transistor (FET) and a storage capacitor. The driver is coupled to each gate of the corresponding memories. The driver includes a first p-channel FET, a second p-channel FET, a third p-channel FET, a fourth p-channel FET, a first n-channel FET, a second n-channel FET, and an output terminal. The first p-channel FET and the second p-channel FET are connected in series. The third p-channel FET and the fourth p-channel FET are connected in series. The first n-channel FET and the second n-channel FET are connected in series. The output terminal outputs an output signal. The output terminal is a connection point at which a drain of the second p-channel FET, a drain of the fourth p-channel FET, and a drain of the first n-channel FET are connected to each other. A first voltage is applied to a source of the first p-channel FET. A second voltage being lower than the first voltage is applied to a source of the third p-channel FET. A third voltage being lower than the first voltage and the second voltage is applied to a source of the second n-channel FET. One of the first voltage, the second voltage, and the third voltage is outputted from the output terminal based on input signals inputted to corresponding gates of the first p-channel FET, the third p-channel FET, the fourth p-channel FET, and the second n-channel FET.

According to still another embodiment of the present invention, there is provided a magnetoresistive random access memory (MRAM) including plural of memories arranged in an array and a driver for driving the memories. Each of the memories has at least an access field effect transistor (FET) and a storage capacitor. The driver is coupled to each gate of the corresponding memories. The driver includes a first p-channel FET, a second p-channel FET, a third p-channel FET, a fourth p-channel FET, a first n-channel FET, a second n-channel FET, and an output terminal. The first p-channel FET and the second p-channel FET are connected in series. The third p-channel FET and the fourth p-channel FET are connected in series. The first n-channel FET and the second n-channel FET are connected in series. The output terminal outputs an output signal. The output terminal is a connection point at which a drain of the second p-channel FET, a drain of the fourth p-channel FET, and a drain of the first n-channel FET are connected to each other. A first voltage is applied to a source of the first p-channel FET. A second voltage being lower than the first voltage is applied to a source of the third p-channel FET. A third voltage being lower than the first voltage and the second voltage is applied to a source of the second n-channel FET. One of the first voltage, the second voltage, and the third voltage is outputted from the output terminal based on input signals inputted to corresponding gates of the first p-channel FET, the third p-channel FET, the fourth p-channel FET, and the second n-channel FET.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As mentioned above, in CMOS technologies, thin- and thick-oxide FETs may be exposed to regular (e.g., 0.8V) and high (e.g., 1.4V) voltages. At around the 14 nm technology node, the FET type was changed to fin from planar to scale further, as a result device manufacturing changed to only thin-oxide FETs. Due to thin-oxide FETs characteristics, long-term exposure to high voltages may cause damages to thin-oxide FETs, particularly to the gate dielectric and source/drain diffusion junctions, which may in turn reduce the life of thin-oxide FET devices.

For example, a memory consists of cell (storage node), access device, word line (WL) and bit line (BL). The access device is typically a thin-oxide FET which may allow higher current and reduce the cell area. However, there might be a WL driver to access cells alongside the WL by driving the access device gates, which is typically constructed using thick-oxide technology to drive higher voltage reliably due to its constant exposure to high voltages.

Reducing high voltage exposure time to the access device (thin-oxide FET) may be fundamental to retain FET characteristics and avoid gate dielectric and source/drain diffusion junction breakdown. Cascode methods may enable appropriate functioning of thin-oxide FET circuits under continuous exposure to high voltages, however only single power rail drivers may be supported. This may result in a reduced life of the access devices (thin-oxide FETs) due to limitless high voltage exposure.

Embodiments of the present disclosure may provide a dual power rail cascode driver which may support both regular and high voltages, and limit the high voltage exposure time to the access device (thin-oxide FET) for a longer device life.

Hereinafter, the term "thin-oxide technology" will be used to refer to the technology of a subject technology node. The term "thick-oxide technology" will be used to refer to the technology of a previous technology node which may include a technology node one or more nodes before the subject technology node. It should be noted that an allowable voltage for thin-oxide technology is generally lower than that for thick-oxide technology.

Figure 1:
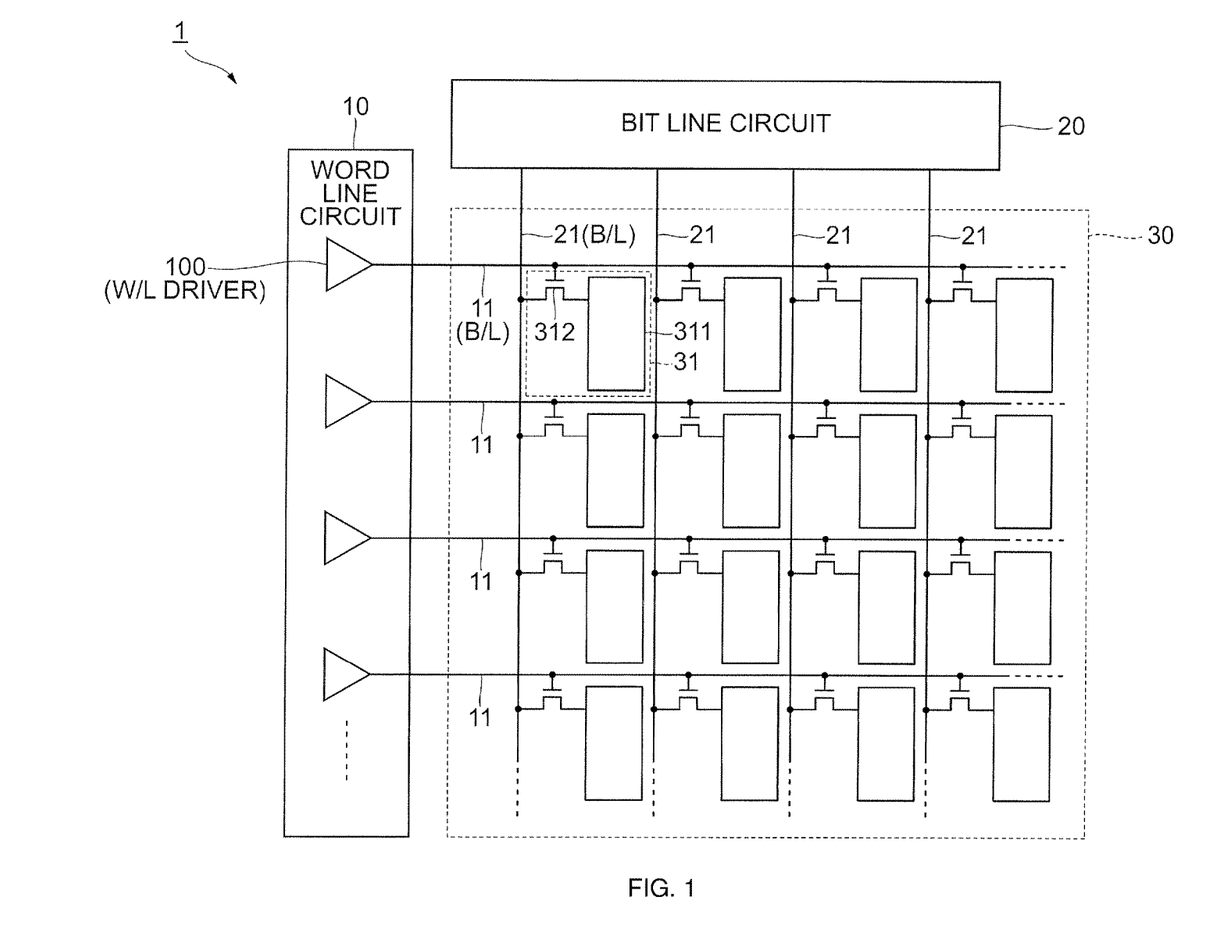
FIG. 1 is a circuit diagram of a dynamic random access memory, according to an embodiment of the present disclosure.

Referring now to FIG. 1 a circuit diagram of a dynamic random access memory (DRAM) 1 is shown, according to an embodiment of the present disclosure. As shown in FIG. 1, the DRAM 1 may include a word line driver circuit 10, a bit line driver circuit 20, a memory cell array 30, word lines (W/L) 11 and bit lines (B/L) 21.

The memory cell array 30 may include multiple memory cells 31 arranged in rows and columns. Each memory cell 31 may include a storage capacitor 311 and an access device 312 coupled in series, and to a corresponding one of the word lines 11 and to a corresponding one of the bit lines 21. Each set including the storage capacitor 311 and the access device 312 is coupled in series between the corresponding word lines 11 and the corresponding bit lines 21. The storage capacitor 311 may be a capacitor in which information is stored. The access device 312 may include, for example, an FET. Specifically, the access device 312 may be formed using a thin-oxide technology in order to decrease a size of the access device 312 and increase a density of the DRAM 1.

The word line driver circuit 10 may include multiple drivers (W/L drivers) 100. Each driver 100 is connected to an end of the corresponding word line 11. The word line driver 10 drives the corresponding word line 11.

The bit line driver circuit 20 may include multiple bit drivers (not shown). Each bit driver is connected to an end of the corresponding bit line 21. The bit line driver circuit 20 inputs/outputs information (data) to/from the memory cells 31.

Each word line 11 is connected to the gates of the access devices 312 aligned along the row direction. Similarly, each bit line 21 is connected to the sources of the access devices 312 aligned along the column direction.

Each access device 312 may allow the corresponding storage capacitor 311 to be selected for read and write operations. In other words, each row of the storage capacitors 311 may be selected by the driver 100 for the read and write operations based on the corresponding word line 11 being asserted.

Each driver 100 driving the corresponding word line 11 may be a world line driver of the DRAM 1. A load of each driver 100 may include the gate of the access device 312. More specifically, each driver 100 may apply a predetermined voltage to the gates of the access devices 312 to control an ON/OFF state of the access devices 312.

In the present embodiment, multiple voltages are applied to the gates of the access devices 312, each of which being a predetermined voltage.

More specifically, in this embodiment, the access devices 312 incorporate a thin-oxide technology and an excess voltage is applied to the access devices 312. The excess voltage may be a voltage higher than the allowable voltage, which is constantly or continuously applied to the access devices 312. Typically, a breakdown between terminals of the FET, such as the gate, the source, and the drain, may shorten a lifetime of the FET.

In embodiments in which the FET may include a silicon-on-insulator (SOI) structure, the breakdown voltage between the gate and the source, and the breakdown voltage between the gate and the drain, are lower than the breakdown voltage between the source and the drain.

In embodiments in which the FET may include a bulk structure, a breakdown between the gate and the body may be added to the SOI structure. However, the breakdown voltage between the gate and the body is higher than each of the breakdown voltages between the gate and the source and between the gate and the drain, because a depletion layer may be formed in the body.

Therefore, from the viewpoint of extending the life of the devices, it may be preferable to keep the voltage applied between the gate and the source and the voltage applied between the gate and the drain equal to or lower than the allowable voltage. On the other hand, applying a high voltage to the access device 312 may improve operation speed (access speed).

Accordingly, embodiments of the present disclosure may provide methods to apply a high voltage to the access device 312. In one embodiment, the access device 312 may include a thicker oxide film. It should be noted that, in this embodiment, the size of the access device 312 (FETs) may be increased. In another embodiment, a time to apply the high voltage is limited or constrained. In this embodiment, the integrated circuit may be fabricated using only a FET including a thin oxide film, as such a higher density may be obtained in the integrated circuit. It should be noted that, in this embodiment, the application of the high voltage may be limited to processes that require a high operation speed, for example, a writing procedure on the memory. It should also be noted that, in a reading procedure, a high voltage may not be necessary, consequently the allowable voltage may be used instead of a high voltage.

Further, the device supplying the higher voltage to the access device 312 (e.g., the drivers 100) is required to limit the applied voltage between terminals to a voltage equal to or lower than the allowable voltage to prevent the device from shortening its own lifetime.

In the present embodiment, each driver 100 may generate different voltages. More specifically, each driver 100 may switch voltages between the allowable voltage (regular voltage) and the excess voltage (high voltage) being higher than the allowable voltage. In other words, each driver 100 may limit a time period to expose the corresponding access devices 312 to the high voltage to prolong the lifetime of the access devices 312. In some embodiments, the driver 100 may include a dynamically switching dual power rail cascode driver.

Further, each driver 100 may include thin-oxide technology. The structure of the driver 100 may prevent the driver 100 from shortening its lifetime. In other words, the structure of the driver 100 may prevent a continuous application of the high voltage between terminals of the devices constituting the driver 100.

Figure 2:
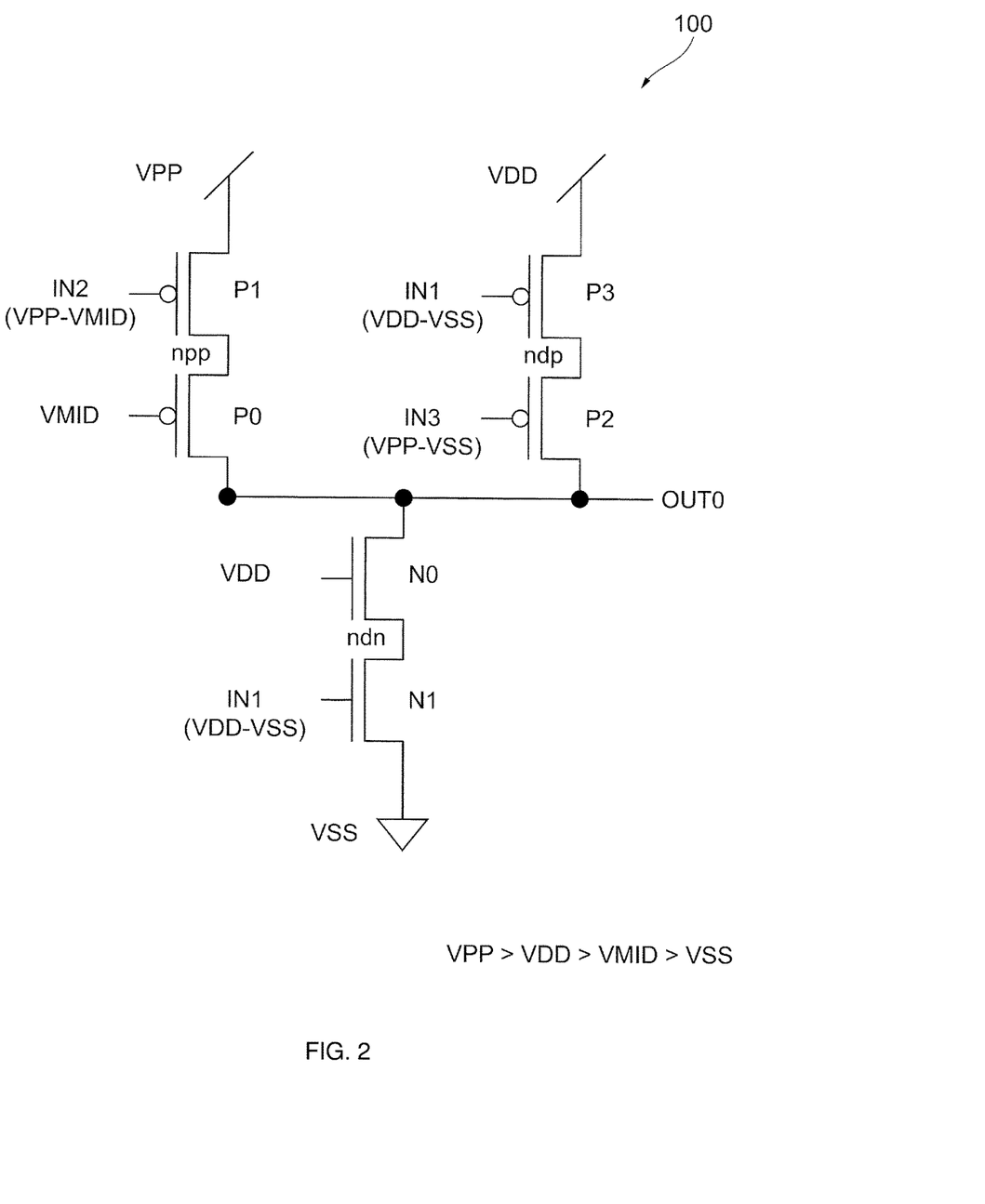
FIG. 2 is a circuit diagram of a driver, according to an embodiment of the present disclosure.

Referring now to FIG. 2 a circuit diagram of the driver 100 is shown, according to an embodiment of the present disclosure. Hereinafter, the regular voltage is referred to as a low voltage VDD. The excess voltage is referred to as a high voltage VPP (VPP>VDD). A reference voltage being lower than the low voltage VDD is expressed as a reference voltage VSS (VDD>VSS). A voltage between the low voltage VDD and the reference voltage VSS is expressed as a middle voltage VMID (VDD>VMID>VSS). The low voltage VDD, the high voltage VPP and the middle voltage are relative to the reference voltage VSS. The reference voltage VSS may be usually set to 0 V. In this embodiment, the high voltage VPP may also be referred to as "first voltage", the low voltage VDD may also be referred to as "second voltage", and the reference voltage VSS may also be referred to as "third voltage".

As shown in FIG. 2, the driver 100 may include four p-channel FETs P0, P1, P2, P3, and two n-channel FETs N0, N1.

The drain of the FET P1 is coupled to the source of the FET P0. The drain of the FET P3 is coupled to the source of the FET P2. The source of the FET N0 is coupled to the drain of the FET N1. The drain of the FET N0 is coupled to the drain of the FET P0 and the drain of the FET P2. In this embodiment, the high voltage VPP is applied to the source of the FET P1, the low voltage VDD is applied to the source of the FET P3, and the reference voltage VSS is applied to the source of the FET N1.

In the embodiment of FIG. 2, two separate rails (a high voltage rail and a low voltage rail) are provided in the driver 100. In other words, the driver 100 may perform as a dual power rail driver. A rail passing through the FET P1, the FET P0, the FET N0, and the FET N1 represents the high voltage rail, while a rail passing through the FET P3, the FET P2, the FET N0, and the FET N1 represents the low voltage rail.

In this embodiment, the middle voltage VMID is constantly applied to the gate of the FET P0, and the low voltage VDD is constantly applied to the gate of the FET N0.

Further, input signals IN1, IN2, IN3 are fed into the driver 100. The input signal IN1 is fed into the gate of the FET N1 and the gate of the FET P3 switching between the low voltage VDD and the reference voltage VSS. In this embodiment, the input signal IN1 has an amplitude VDD-VSS. The input signal IN2 is fed into the gate of the FET P1 switching between the high voltage VPP and the middle voltage VMID. In this embodiment, the input signal IN2 has an amplitude VPP-VMID. The input signal IN3 is fed into the gate of the FET P2 switching between the high voltage VPP and the reference voltage VSS. In this embodiment, the input signal IN3 has an amplitude VPP-VSS.

It should be noted that a connection point of the drain of the FET P0, the drain of the FET P2, and the drain of the FET N0 represents an output point for outputting an output signal OUT0.

The p-channel FET P1 may also be referred as "first p-channel FET", the p-channel FET P0 may also be referred as "second p-channel FET", the p-channel FET P3 may also be referred as "third p-channel FET", the p-channel FET P2 may be referred as "fourth p-channel FET", the n-channel FET N0 may also be referred as "first n-channel FET", the n-channel FET N1 may also be referred as "second n-channel FET", and the output point for outputting an output signal OUT0 may also be referred as "output terminal".

Hereinafter, the operation of the driver 100 will be explained. In one embodiment, for example, the high voltage VPP may be approximately 1.4 V, the low voltage VDD may be approximately 0.8 V, the reference voltage VSS may be approximately 0 V, and the middle voltage VMID may be approximately 0.6 V. A threshold voltage of the p-channel FETs P0, P1, P2, P3 may be assumed to be approximately −0.2 V and a threshold voltage of the n-channel FETs N0, N1 may be assumed to be approximately 0.2 V. It should be noted that, in some embodiments, the middle voltage VMID may be calculated as VMID=VPP−VDD.

In this embodiment, the FET P0 may be in a weak ON state with the middle voltage VMID being constantly applied to the gate of the FET P0. Additionally, the FET N0 may be in a strong ON state with the low voltage VDD being constantly applied to the gate of the FET N0.

Figure 3:
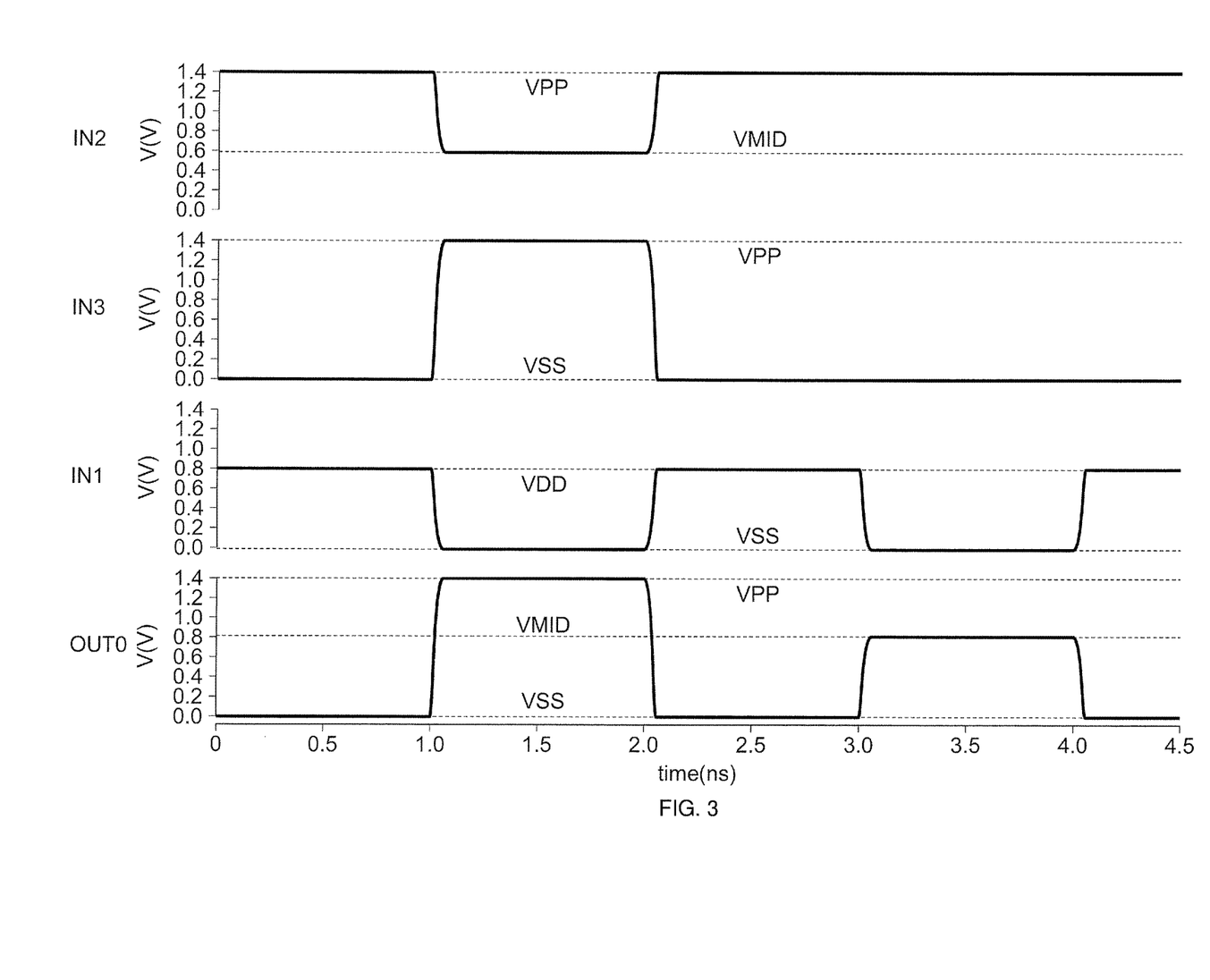
FIG. 3 is a timing chart of the operation of the driver, according to an embodiment of the present disclosure.

Referring now to FIG. 3, a timing chart of the operation of the driver 100 is shown, according to an embodiment of the present disclosure. In this embodiment, the horizontal axis indicates time (ns) while the vertical axis indicates voltages of the input signals IN1, IN2, IN3 and the output signal OUT0. The driver 100 outputs the high voltage VPP (1.4 V) in a period from 1.0 ns to 2.0 ns, the low voltage VDD (0.8 V) in a period from 3.0 ns to 4.0 ns, and the reference voltage VSS (0 V) in the remaining time period.

At time 0.0 ns, the input signal IN1 is the low voltage VDD (0.8 V), the input signal IN2 is the high voltage VPP (1.4 V) and the input signal IN3 is the reference voltage VSS (0 V).

Referring now to FIG. 2 and FIG. 3 simultaneously, the FET P1 with the gate applied with the input signal IN2 (1.4 V) is in OFF state. The FET P2 with the gate applied with the input signal IN3 (0 V) is in ON state. The FET P3 with the gate applied with the input signal IN1 (0.8 V) is in OFF state. The FET N1 with the gate applied with the input signal IN1 (0.8 V) is in ON state. As explained above, the FET N0 with the gate constantly applied with the low voltage VDD is in the strong ON state.

Here, the FET P1 included in the high voltage rail is in the OFF state and the FET P3 included in the low voltage rail is also in the OFF state, so that both of the high voltage VPP and the low voltage VDD are not outputted as the output signal OUT0. In contrast, the FET N1 and the FET N0 are in the ON state, so that the output signal OUT0 becomes the reference voltage VSS (0 V).

Since the middle voltage VMID (0.6 V) is applied to the gate of the FET P0, a voltage of a connection point npp of the drain of the FET P1 and the source of the FET P0 is maintained equal to or higher than the middle voltage VMID. For example, the voltage of the connection point npp becomes 0.6 V when the input signal IN2 equal to 1.4 V is applied.

Since the gate of the FET P2 is applied with the reference voltage VSS (0 V), the FET P2 is in the strong ON state. Therefore, a voltage of a connection point ndp between the drain of the FET P3 and the source of the FET P2 is 0 V.

Since the FET N1 and the FET N0 are in the strong ON state, a voltage of a connection point ndn between the drain of the FET N1 and the source of the FET N0 becomes 0 V.

In another embodiment a steady state voltage may be applied to the FET devices of FIG. 2. It should be noted that a "voltage in a steady state" refers to a voltage that is constantly or continuously applied to the FET devices. In this embodiment, the voltage in steady state may be applied as follows:

In the FET P1, a voltage between the gate (IN2: 1.4 V) and the source (VPP: 1.4 V), i.e. a gate-to-source voltage, may be 0 V, a voltage between the gate (IN2: 1.4 V) and the drain (npp: 0.6 V), i.e. a gate-to-drain voltage, may be 0.8 V, and a voltage between the source (VPP: 1.4 V) and the drain (npp: 0.6 V), i.e. a source-to-drain voltage, may be 0.8 V.

In the FET P0, a voltage between the gate (VMID: 0.6 V) and the source (npp: 0.6 V) may be 0 V, a voltage between the gate (VMID: 0.6 V) and the drain (OUT0: 0 V) is 0.6 V, and a voltage between the source (npp: 0.6 V) and the drain (OUT0: 0 V) may be 0.6 V.

In the FET P3, a voltage between the gate (IN1: 0.8 V) and the source (VDD: 0.8 V) may be 0 V, a voltage between the gate (IN1: 0.8 V) and the drain (ndp: 0 V) may be 0.8 V, and a voltage between the source (VDD: 0.8 V) and the drain (ndp: 0 V) may be 0.8 V.

In the FET P2, a voltage between the gate (IN3: 0 V) and the source (ndp: 0 V) may be 0 V, a voltage between the gate (IN3: 0 V) and the drain (OUT0: 0 V) may be 0 V, and a voltage between the source (ndp: 0 V) and the drain (OUT0: 0 V) may be 0 V.

In the FET N1, a voltage between the gate (IN1: 0.8 V) and the source (VSS: 0 V) may be 0.8 V, a voltage between the gate (IN1: 0.8 V) and the drain (ndn: 0 V) may be 0.8 V, and a voltage between the source (VSS: 0 V) and the drain (ndn: 0 V) may be 0 V.

In the FET N0, a voltage between the gate (VDD: 0.8 V) and the source (ndn: 0 V) may be 0.8 V, a voltage between the gate (VDD: 0.8 V) and the drain (OUT0: 0 V) may be 0.8 V, and a voltage between the source (ndn: 0 V) and the drain (OUT0: 0 V) may be 0 V.

As mentioned above, at time 0.0 ns every voltage between the gate and the source, the gate and the drain, and the source and the drain of all FET devices included in the driver 100 is equal to or lower than the low voltage VDD (0.8 V), which represents an allowable voltage for the thin-oxide technology.

At time 1.0 ns, the input signal IN1 is switched from the low voltage VDD (0.8 V) to the reference voltage VSS (0 V), the input signal IN2 is switched from the high voltage VPP (1.4 V) to the middle voltage VMID (0.6 V), and the input signal IN3 is switched from the reference voltage VSS (0 V) to the high voltage VPP (1.4 V).

The FET N1 with the gate applied with the input signal IN1 (0 V) is turned OFF. This disconnects a rail for outputting the reference voltage VSS. Also, the FET P3) with the gate applied with the input signal IN1 (0 V) is turned ON.

The FET P2 with the gate applied with the input signal IN3 (1.4 V) is turned OFF. This disconnects the low voltage rail for outputting the low voltage VDD even if the FET P3 is in the ON state.

The FET P1 with the gate applied with the input signal IN2 (0.6 V) is turned ON. Also, the FET P0 is in the ON state. This switches the output signal OUT0 from the reference voltage VSS (0 V) to the high voltage VPP (1.4 V) via the rail passing through the FET P1 and the FET P0.

Then, the voltage of the connection point npp between the drain of the FET P0 and the source of the FET P1 becomes the high voltage VPP (1.4 V).

Since the FET P3 is in the sufficient or strong ON state, the voltage of the connection point ndp between the drain of the FET P3 and the source of the FET P2 is maintained to be the low voltage VDD (0.8 V).

Since the FET N0 is in the ON state, the voltage of the connection point ndn between the drain of the FET N1 and the source of the FET N0) is 0.8 V.

As mentioned above, at time 1.0 ns the high voltage VPP (1.4 V) is outputted as the output signal OUT0 via the high voltage rail.

In the FET P1, the voltage between the gate (IN2: 0.6 V) and the source (VPP: 1.4 V) is 0.8 V, the voltage between the gate (IN2: 0.6 V) and the drain (npp: 1.4 V) is 0.8 V, and the voltage between the source (VPP: 1.4 V) and the drain (npp: 1.4 V) is 0 V.

In the FET P0, the voltage between the gate (VMID: 0.6 V) and the source (npp: 1.4 V) is 0.8 V, the voltage between the gate (VMID: 0.6 V) and the drain (OUT0: 1.4 V) is 0.8 V, and the voltage between the source (npp: 1.4 V) and the drain (OUT0: 1.4 V) is 0 V.

In the FET P3, the voltage between the gate (IN1: 0 V) and the source (VDD: 0.8 V) is 0.8 V, the voltage between the gate (IN1: 0 V) and the drain (ndp: 0.8 V) is 0.8 V, and the voltage between the source (VDD: 0.8 V) and the drain (ndp: 0.8 V) is 0 V.

In the FET P2, the voltage between the gate (IN3: 1.4 V) and the source (ndp: 0.8 V) is 0.6 V, the voltage between the gate (IN3: 1.4 V) and the drain (OUT0: 1.4 V) is 0 V, and the voltage between the source (ndp: 0.8 V) and the drain (OUT0: 1.4 V) is 0.6 V.

In the FET N1, the voltage between the gate (IN1: 0 V) and the source (VSS: 0 V) is 0 V, the voltage between the gate (IN1: 0 V) and the drain (ndn: 0.8 V) is 0.8 V, and the voltage between the source (VSS: 0 V) and the drain (ndn: 0.8 V) is 0.8 V.

In the FET N0, the voltage between the gate (VDD: 0.8 V) and the source (ndn: 0.8 V) is 0 V, the voltage between the gate (VDD: 0.8 V) and the drain (OUT0: 1.4 V) is 0.6 V, and the voltage between the source (ndn: 0.8 V) and the drain (OUT0: 1.4 V) is 0.6 V.

As mentioned above, at time 1.0 ns every voltage between the gate and the source, the gate and the drain, and the source and the drain of all FET devices included in the driver 100 is equal to or lower than the low voltage VDD (0.8 V), which represents the allowable voltage for the thin-oxide technology.

At time 2.0 ns, the input signal IN1 is switched from the reference voltage VSS (0 V) to the low voltage VDD (0.8 V), the input signal IN2 is switched from the middle voltage VMID (0.6 V) to the high voltage VPP (1.4 V), and the input signal IN3 is switched from the high voltage VPP (1.4 V) to the reference voltage VSS (0 V).

This condition is the same as at time 0.0 ns. More specifically, the output signal OUT0 becomes the reference voltage VSS (0 V). The FET P1 is in the OFF state, the FET P2 is in the ON state, the FET P3 is in the OFF state, and the FET N1 is in the ON state. The FET P0 and the FET N0 are constantly in the ON state.

At time 3.0 ns, the input signal IN1 is switched from the low voltage VDD (0.8 V) to the reference voltage VSS (0 V). The input signal IN2 is maintained at the high voltage VPP (1.4 V), and the input signal IN3 is maintained at the reference voltage VSS (0 V).

The FET N1 with the gate applied with the input signal IN1 (0 V) is turned OFF. This disconnects the rail for outputting the reference voltage VSS (0 V). The FET P3 with the gate applied with the input signal IN1 (0 V) is turned ON. This connects the low voltage rail for outputting the low voltage VDD (0.8 V) via the FET P3 and the FET P2 since the FET P2 is in the ON state. In other words, the low voltage VDD (0.8 V) is outputted as the output signal OUT0.

Conversely, since the FET P1 is in the OFF state, the high voltage rail for outputting the high voltage VPP is disconnected.

As mentioned above, at time 3.0 ns the low voltage VDD (0.8 V) is outputted as the output signal OUT0 via the low voltage rail.

Since the middle voltage VMID (0.6 V) is applied to the gate of the FET P0, the voltage of the connection point npp between the drain of the FET P1 and the source of the FET P0 is the voltage of the output signal OUT0 (VDD: 0.8 V) via the FET P0 in the ON state.

Since the FET P2 and the FET P3 are in the strong ON state, the voltage of the connection point ndp between the drain of the FET P3 and the source of the FET P2 is the low voltage VDD (0.8 V).

Since the output signal OUT0 is the low voltage VDD (0.8 V), the voltage of the connection point ndn between the drain of the FET N1 and the source of the FET N0 is the voltage of the output signal OUT0 (VDD: 0.8 V) via the FET N0 in the ON state.

In the FET P1, the voltage between the gate (IN2: 1.4 V) and the source (VPP: 1.4 V) is 0 V, the voltage between the gate (IN2: 1.4 V) and the drain (npp: 0.8 V) is 0.6 V, and the voltage between the source (VPP: 1.4 V) and the drain (npp: 0.8 V) is 0.6 V.

In the FET P0, the voltage between the gate (VMID: 0.6 V) and the source (npp: 0.8 V) is 0.2 V, the voltage between the gate (VMID: 0.6 V) and the drain (OUT0: 0.8 V) is 0.2 V, and the voltage between the source (npp: 0.8 V) and the drain (OUT0: 0.8 V) is 0 V.

In the FET P3, the voltage between the gate (IN1: 0 V) and the source (VDD: 0.8 V) is 0.8 V, the voltage between the gate (IN1: 0 V) and the drain (ndp: 0.8 V) is 0.8 V, and the voltage between the source (VDD: 0.8 V) and the drain (ndp: 0.8 V) is 0 V.

In the FET P2, the voltage between the gate (IN3: 0 V) and the source (ndp: 0.8 V) is 0.8 V, the voltage between the gate (IN3: 0 V) and the drain (OUT0: 0.8 V) is 0.8 V, and the voltage between the source (ndp: 0.8 V) and the drain (OUT0: 0.8 V) is 0 V.

In the FET N1, the voltage between the gate (IN1: 0 V) and the source (VSS: 0 V) is 0 V, the voltage between the gate (IN1: 0 V) and the drain (ndn: 0.8 V) is 0.8 V, and the voltage between the source (VSS: 0 V) and the drain (ndn: 0.8 V) is 0.8 V.

In the FET N0, the voltage between the gate (VDD: 0.8 V) and the source (ndn: 0.8 V) is 0 V, the voltage between the gate (VDD: 0.8 V) and the drain (OUT0: 0.8 V) is 0 V, and the voltage between the source (ndn: 0.8 V) and the drain (OUT0: 0.8 V) is 0 V.

As mentioned above, at time 3.0 ns every voltage between the gate and the source, the gate and the drain, and the source and the drain of all devices (FETs) included in the driver 100 is equal to or lower than the low voltage VDD (0.8 V), which is the allowable voltage for thin-oxide technology.

At time 4.0 ns, the input signal IN1 is switched from the reference voltage VSS (0 V) to the low voltage VDD (0.8 V), the input signal IN2 is maintained at the high voltage VPP (1.4 V), and the input signal IN3 is maintained at the reference voltage VSS (0 V).

This condition is the same as at time 0.0 ns and time 2.0 ns. Also, the output signal OUT0 becomes the reference voltage VSS (0 V).

As mentioned above, the driver 100 outputs two different voltages, namely the high voltage VPP and the low voltage VDD as the output signal OUT0. Controlling the time period for outputting the high voltage VPP enables to limit the time period in which the access devices 312 are exposed to the high voltage VPP.

In this example, changing combinations of the input signals IN1, IN2, IN3 leads to switching the output signal OUT0 between the high voltage VPP and the low voltage VDD. It should be noted that in this example a rise time and a fall time of the output signal OUT0 is less than 0.1 ns, as shown in FIG. 3.

The driver 100 may prevent the FET devices (FETs) constituting the driver 100 from being applied with the high voltage VPP between the gate and the source, between the gate and the drain, and between the source and the drain in the respective devices. This may enable the fabrication of the driver 100 using thin-oxide technology, similarly to the access devices 312. More specifically, the drivers 100 and the access devices 312 may be fabricated using thin-oxide technology which may simplify the manufacturing process of the drivers 100 and the access devices 312.

It should be noted that in the high voltage rail with the FETs P1, P0, N0, and N1, the FET P1 and the FET N1 constitute an inverter circuit in the driver 100, and the FET P0 and the FET N0 provided between the FET P1 and the FET N1 are the so called cascode devices.

The FET P0 may protect the FET P1 by preventing the application of the high voltage VPP to the FET P1 when the output signal OUT0 is the high voltage VPP.

The FET N0 may protect the FET N1 by preventing the application of the high voltage VPP to the FET N1 when the output signal OUT0 is the high voltage VPP.

Specifically, the cascode devices such as the FETs P0, N0 disperse the high voltage VPP to prevent the application of the high voltage VPP to each of the FETs P0, P1, P2, P3, N0, and N1.

Moreover, the FET P2 turns OFF to protect the FET P3, preventing the application of the high voltage VPP to the FET P3, when the output signal OUT0 is the high voltage VPP. On the other hand, The FET P2 turns ON to supply the low voltage to the output signal OUT0.

It should be noted that the FET P2 may be switched ON/OFF dynamically. This means that the FET P2 is different from the conventional cascode devices, such as the FETs P0, N0 whose gates are applied with the fixed voltage.

In the above embodiments, the drivers 100 are provided or arranged in the DRAM 1, however, the drivers 100 may be arranged in other types of memory devices.

For example, the drivers 100 may be provided in a flash memory. In embodiments in which the drivers 100 are provided in a flash memory, the flash memory may not include the storage capacitor 311.

For example, the drivers 100 may be provided in a ferroelectric random access memory (FeRAM). The FeRAM may include a ferroelectric material (film) instead of the storage capacitor 311. In the FeRAM, the ferroelectric material may change the polarization according to the polarity of an applied voltage.

For example, the drivers 100 may be provided in a magnetoresistive random access memory (MRAM). The MRAM may include a tunnel magneto resistance film instead of the storage capacitor 311. The MRAM utilizes a magnetoresistive effect changing an electroconductivity according to an angle of magnetization.

For example, the drivers 100 may be provided in a phase change memory (PCM). The PCM may include a phase change material (film) instead of the storage capacitor 311. The PCM utilizes changing of a resistance according to a phase change.

For example, the drivers 100 may be provided in a resistive random access memory (RRAM). The RRAM may include a strongly correlated electron system material instead of the storage capacitor 311. The RRAM utilizes a colossal electro-resistance (CER) effect changing an electric resistance widely by applying a voltage.

For example, the drivers 100 may be provided in a liquid crystal display panel to control the liquid crystal pixels thereof.

For example, the drivers 100 may be provided in an organic light emitting diode (OLED) display panel to control the OLED pixels thereof.

Figure 4:
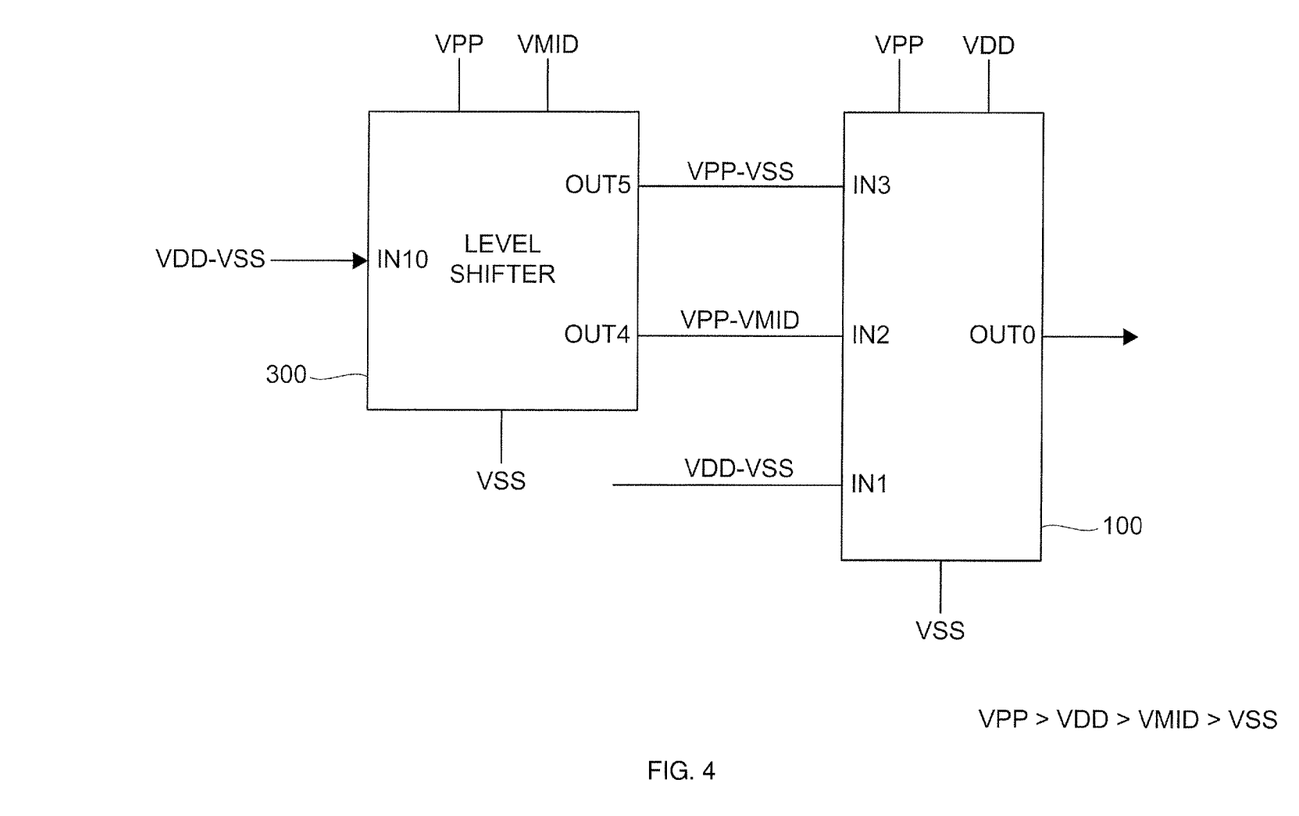
FIG. 4 is a block diagram of a level shifter, according to an embodiment of the present disclosure.

Referring now to FIG. 4, a block diagram of a level shifter 300 is shown, according to an embodiment of the present disclosure. As mentioned above, the driver 100 may receive the input signal IN1 having amplitude (VDD-VSS), the input signal IN2 having amplitude (VPP-VMID) and the input signal IN3 having amplitude (VPP-VSS). A driving circuit of the driver 100 is not limited to a particular circuit. For example, the input signal IN1 having amplitude (VDD-VSS) may be generated by a conventional circuit (not shown). On the other hand, the input signal IN3 having amplitude (VPP-VSS) has wider amplitude than the input signal IN1 having amplitude (VDD-VSS). In addition, the input signal IN2 having amplitude (VPP-VMID) has more complicated amplitude than the input signal IN1 having amplitude (VDD-VSS). The input signal IN2 and the input signal IN3 may be generated especially by the level shifter 300 shown in FIG. 4.

The level shifter 300 may receive an input signal IN10 having the amplitude (VDD-VSS) to generate and output an output OUT5 (the input IN3) having the amplitude (VPP-VSS) and an output OUT4 (the input IN2) having the amplitude (VPP-VMID).

According to one embodiment of the present disclosure a driver may include: a first p-channel field effect transistor (FET) and a second p-channel FET connected in series; a third p-channel FET and a fourth p-channel FET connected in series; a first n-channel FET and a second n-channel FET connected in series; and an output terminal for outputting an output signal, the output terminal being a connection point at which a drain of the second p-channel FET, a drain of the fourth p-channel FET, and a drain of the first n-channel FET are connected to each other, where a first voltage is applied to a source of the first p-channel FET, a second voltage being lower than the first voltage is applied to a source of the third p-channel FET, a third voltage being lower than the first voltage and the second voltage is applied to a source of the second n-channel FET, and one of the first voltage, the second voltage, and the third voltage is outputted from the output terminal based on input signals inputted to corresponding gates of the first p-channel FET, the third p-channel FET, the fourth p-channel FET, and the second n-channel FET.

A voltage being equal to or lower than a difference voltage between the second voltage and the third voltage is constantly applied to corresponding gate-to-source and corresponding gate-to-drain of the first p-channel FET, the second p-channel FET, the third p-channel FET, the fourth p-channel FET, the first n-channel FET, and the second n-channel FET.

The second p-channel FET, the fourth p-channel FET, and the first n-channel FET are cascode devices for preventing an applied voltage from constantly exceeding a difference voltage between the second voltage and the third voltage, the applied voltage being a voltage applied to corresponding gate-to-source and corresponding gate-to-drain of the first p-channel FET, the third p-channel FET, the fourth p-channel FET, and the second n-channel FET.

A gate of the second p-channel FET and a gate of the first n-channel FET are respectively applied with a fixed voltage.

The first p-channel FET is set to ON, the third p-channel FET is set to ON, the fourth p-channel FET is set to ON, and the second n-channel FET is set to OFF in a case where the first voltage is outputted from the output terminal.

The first p-channel FET is set to OFF, the third p-channel FET is set to ON, the fourth p-channel FET is set to ON, and the second n-channel FET is set to OFF in case where the second voltage is outputted from the output terminal.

The first p-channel FET is set to OFF, the third p-channel FET is set to OFF, the fourth p-channel is set to OFF, and the second n-channel FET is set to ON in a case where the third voltage is outputted from the output terminal.

Therefore, embodiments of the present disclosure may provide a dual power rail cascode WL driver capable of supporting regular and high voltages and limit the high voltage exposure time to the access device (thin-oxide FET) for a longer useful life.

According to an embodiment of the present disclosure, a dynamic random-access memory (DRAM) may include a plurality of memories arranged in an array, each of the memories having at least an access field effect transistor (FET) and a storage capacitor; and a driver for driving the memories, the driver coupled to each gate of the corresponding memories, the driver includes: a first p-channel field effect transistor (FET) and a second p-channel FET connected in series; a third p-channel FET and a fourth p-channel FET connected in series; a first n-channel FET and a second n-channel FET connected in series; and an output terminal for outputting an output signal, the output terminal being a connection point at which a drain of the second p-channel FET, a drain of the fourth p-channel FET, and a drain of the first n-channel FET are connected to each other, where a first voltage is applied to a source of the first p-channel FET, a second voltage being lower than the first voltage is applied to a source of the third p-channel FET, a third voltage being lower than the first voltage and the second voltage is applied to a source of the second n-channel FET, and one of the first voltage, the second voltage, and the third voltage is outputted from the output terminal based on input signals inputted to the corresponding gates of the first p-channel FET, the third p-channel FET, the fourth p-channel FET, and the second n-channel FET.

According to another embodiment of the present disclosure, a flash memory may include a plurality of memories arranged in an array, each of the memories having at least an access field effect transistor (FET) provided with a floating gate; and a driver for driving the memories, the driver coupled to each gate of the corresponding memories, the driver includes: a first p-channel field effect transistor (FET) and a second p-channel FET connected in series; a third p-channel FET and a fourth p-channel FET connected in series; a first n-channel FET and a second n-channel FET connected in series; and an output terminal for outputting an output signal, the output terminal being a connection point at which a drain of the second p-channel FET, a drain of the fourth p-channel FET, and a drain of the first n-channel FET are connected to each other, where a first voltage is applied to a source of the first p-channel FET, a second voltage being lower than the first voltage is applied to a source of the third p-channel FET, a third voltage being lower than the first voltage and the second voltage is applied to a source of the second n-channel FET, and one of the first voltage, the second voltage, and the third voltage is outputted from the output terminal based on input signals inputted to the corresponding gates of the first p-channel FET, the third p-channel FET, the fourth p-channel FET, and the second n-channel FET.

A ferroelectric random access memory (FeRAM) including: a plurality of memories arranged in an array, each of the memories having at least an access field effect transistor (FET) and a ferroelectric material film; and a driver for driving the memories, the driver coupled to each gate of the corresponding memories, the driver includes: a first p-channel field effect transistor (FET) and a second p-channel FET connected in series; a third p-channel FET and a fourth p-channel FET connected in series; a first n-channel FET and a second n-channel FET connected in series; and an output terminal for outputting an output signal, the output terminal being a connection point at which a drain of the second p-channel FET, a drain of the fourth p-channel FET, and a drain of the first n-channel FET are connected to each other, where a first voltage is applied to a source of the first p-channel FET, a second voltage being lower than the first voltage is applied to a source of the third p-channel FET, a third voltage being lower than the first voltage and the second voltage is applied to a source of the second n-channel FET, and one of the first voltage, the second voltage, and the third voltage is outputted from the output terminal based on input signals inputted to the corresponding gates of the first p-channel FET, the third p-channel FET, the fourth p-channel FET, and the second n-channel FET.

According to another embodiment of the present disclosure, a magnetoresistive random access memory (MRAM) may include a plurality of memories arranged in an array, each of the memories having at least an access field effect transistor (FET) and a tunnel magneto resistance film; and a driver for driving the memories, the driver coupled to each gate of the corresponding memories, the driver includes: a first p-channel field effect transistor (FET) and a second p-channel FET connected in series; a third p-channel FET and a fourth p-channel FET connected in series; a first n-channel FET and a second n-channel FET connected in series; and an output terminal for outputting an output signal, the output terminal being a connection point at which a drain of the second p-channel FET, a drain of the fourth p-channel FET, and a drain of the first n-channel FET are connected to each other, where a first voltage is applied to a source of the first p-channel FET, a second voltage being lower than the first voltage is applied to a source of the third p-channel FET, a third voltage being lower than the first voltage and the second voltage is applied to a source of the second n-channel FET, and one of the first voltage, the second voltage, and the third voltage is outputted from the output terminal based on input signals inputted to the corresponding gates of the first p-channel FET, the third p-channel FET, the fourth p-channel FET, and the second n-channel FET.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    applying a first voltage to a source of a first p-channel field effect transistor (FET), wherein the first p-channel FET is connected in series with a second p-channel FET;
    applying a second voltage to a source of a third p-channel FET, the second voltage is lower than the first voltage, wherein the third p-channel FET is connected in series with a fourth p-channel FET;
    applying a third voltage to a source of a second n-channel FET, the third voltage is lower than the first voltage and the second voltage, wherein the second n-channel FET is connected in series with a first n-channel FET,
    wherein a drain of the second p-channel FET, a drain of the fourth p-channel FET, and a drain of the first n-channel FET are connected to each other at a connection point, wherein the connection point comprises an output terminal for outputting an output signal; and
    outputting one of the first voltage, the second voltage, and the third voltage from the output terminal based on input signals inputted to corresponding gates of the first p-channel FET, the third p-channel FET, the fourth p-channel FET, and the second n-channel FET, wherein the first voltage is output based on:
        setting the first p-channel FET to ON,
        setting the third p-channel FET to ON,
        setting the fourth p-channel FET to ON, and
        setting the second n-channel FET to OFF.

2. The method according to claim 1, further comprising:
    constantly applying a voltage equal to or lower than a difference voltage between the second voltage and the third voltage to corresponding gate-to-source and corresponding gate-to-drain of the first p-channel FET, the second p-channel FET, the third p-channel FET, the fourth p-channel FET, the first n-channel FET, and the second n-channel FET.

3. The method according to claim 2, wherein the second p-channel FET, the fourth p-channel FET, and the first n-channel FET are cascode devices for preventing the applied voltage from constantly exceeding the difference voltage between the second voltage and the third voltage.

4. The method according to claim 1, further comprising:
    applying a fixed voltage to a gate of the second p-channel FET and a gate of the first n-channel FET, respectively.

5. The method according to claim 1, wherein the second voltage is output based on the following steps:
    setting the first p-channel FET to OFF;
    setting the third p-channel FET to ON;
    setting the fourth p-channel FET to ON; and
    setting the second n-channel FET to OFF.

6. The method according to claim 1, wherein the third voltage is output based on the following steps:
    setting the first p-channel FET to OFF;
    setting the third p-channel FET to OFF;
    setting the fourth p-channel to OFF; and
    setting the second n-channel FET to ON.

7. A driver comprising:
    a first p-channel field effect transistor (FET) and a second p-channel FET connected in series;
    a third p-channel FET and a fourth p-channel FET connected in series;
    a first n-channel FET and a second n-channel FET connected in series; and
    an output terminal for outputting an output signal, the output terminal being a connection point at which a drain of the second p-channel FET, a drain of the fourth p-channel FET, and a drain of the first n-channel FET are connected to each other, wherein
    a first voltage is applied to a source of the first p-channel FET,
    a second voltage being lower than the first voltage is applied to a source of the third p-channel FET,
    a third voltage being lower than the first voltage and the second voltage is applied to a source of the second n-channel FET, and
    one of the first voltage, the second voltage, and the third voltage is outputted from the output terminal based on input signals inputted to corresponding gates of the first p-channel FET, the third p-channel FET, the fourth p-channel FET, and the second n-channel FET, wherein the first p-channel FET is set to ON, the third p-channel FET is set to ON, the fourth p-channel FET is set to ON, and the second n-channel FET is set to OFF causing the first voltage to be output from the output terminal.

8. The driver according to claim 7, wherein a voltage being equal to or lower than a difference voltage between the second voltage and the third voltage is constantly applied to corresponding gate-to-source and corresponding gate-to-drain of the first p-channel FET, the second p-channel FET, the third p-channel FET, the fourth p-channel FET, the first n-channel FET, and the second n-channel FET.

9. The driver according to claim 8, wherein the second p-channel FET, the fourth p-channel FET, and the first n-channel FET are cascode devices for preventing the applied voltage from constantly exceeding the difference voltage between the second voltage and the third voltage.

10. The driver according to claim 7, wherein a gate of the second p-channel FET and a gate of the first n-channel FET are respectively applied with a fixed voltage.

11. The driver according to claim 7, wherein the first p-channel FET is set to OFF, the third p-channel FET is set to ON, the fourth p-channel FET is set to ON, and the second n-channel FET is set to OFF, causing the second voltage to be output from the output terminal.

12. The driver according to claim 7, wherein the first p-channel FET is set to OFF, the third p-channel FET is set to OFF, the fourth p-channel is set to OFF, and the second n-channel FET is set to ON, causing the third voltage to be output from the output terminal.

13. A memory device comprising:
a plurality of memories arranged in the memory device, the memory device comprising a dynamic random-access memory (DRAM), each memory in the plurality of memories comprises at least one access field effect transistor (FET) and a storage capacitor; and
a driver for driving the plurality of memories, the driver is coupled to a gate of each memory in the plurality of memories,
wherein the driver comprises:
a first p-channel field effect transistor (FET) and a second p-channel FET connected in series;
a third p-channel FET and a fourth p-channel FET connected in series;
a first n-channel FET and a second n-channel FET connected in series; and
an output terminal for outputting an output signal, the output terminal being a connection point at which a drain of the second p-channel FET, a drain of the fourth p-channel FET, and a drain of the first n-channel FET are connected to each other, wherein
a first voltage is applied to a source of the first p-channel FET,
a second voltage being lower than the first voltage is applied to a source of the third p-channel FET,
a third voltage being lower than the first voltage and the second voltage is applied to a source of the second n-channel FET, and
one of the first voltage, the second voltage, and the third voltage is outputted from the output terminal based on input signals inputted to corresponding gates of the first p-channel FET, the third p-channel FET, the fourth p-channel FET, and the second n-channel FET, wherein the first p-channel FET is set to ON, the third p-channel FET is set to ON, the fourth p-channel FET is set to ON, and the second n-channel FET is set to OFF causing the first voltage to be output from the output terminal.

14. The memory device according to claim 13, further comprising:
a plurality of memories arranged in a flash memory, each memory in the plurality of memories comprises at least one access field effect transistor (FET) provided with a floating gate.

15. The memory device according to claim 13, further comprising:
a plurality of memories arranged in a ferroelectric random access memory (FeRAM), each memory in the plurality of memories comprises at least one access field effect transistor (FET) and a ferroelectric material film.

16. The memory device according to claim 13, further comprising:
a plurality of memories arranged in a magnetoresistive random access memory (MRAM), each memory in the plurality of memories comprises at least one access field effect transistor (FET) and a tunnel magneto resistance film.

17. The memory device according to claim 13, further comprising:
a plurality of memories arranged in a phase change memory (PCM), each memory in the plurality of memories comprises at least one access field effect transistor (FET) and a phase changing film.

18. The memory device according to claim 13, further comprising:
a plurality of memories arranged in a resistive random access memory (RRAM), each memory in the plurality of memories comprises at least one access field effect transistor (FET) and a strongly correlated electron system material.

* * * * *